United States Patent
Zheng et al.

(10) Patent No.: US 11,597,337 B2
(45) Date of Patent: Mar. 7, 2023

(54) POWER MANAGEMENT SYSTEM FOR AUTONOMOUS VEHICLES

(71) Applicant: TUSIMPLE, INC., San Diego, CA (US)

(72) Inventors: Kaixin Zheng, San Diego, CA (US); Xiaoling Han, San Diego, CA (US); Zehua Huang, San Diego, CA (US); Yue Pan, San Diego, CA (US); Zhaohan Jia, San Diego, CA (US)

(73) Assignee: TUSIMPLE, INC., San Diego, CA (US)

( * ) Notice: Subject to any disclaimer, the term of this patent is extended or adjusted under 35 U.S.C. 154(b) by 276 days.

(21) Appl. No.: 16/781,936

(22) Filed: Feb. 4, 2020

(65) Prior Publication Data

US 2021/0237667 A1  Aug. 5, 2021

(51) Int. Cl.
*H02H 3/08* (2006.01)
*B60R 16/023* (2006.01)
*G07C 5/08* (2006.01)
*G05D 1/00* (2006.01)

(52) U.S. Cl.
CPC .......... *B60R 16/0232* (2013.01); *G07C 5/085* (2013.01); *G05D 1/0088* (2013.01)

(58) Field of Classification Search
None
See application file for complete search history.

(56) References Cited

U.S. PATENT DOCUMENTS

| | | | | |
|---|---|---|---|---|
| 5,504,655 A | * | 4/1996 | Underwood | H02M 7/003 439/911 |
| 2004/0156154 A1 | * | 8/2004 | Lazarovich | H02H 3/08 361/42 |
| 2017/0279261 A1 | * | 9/2017 | Riley | H02H 3/08 |

* cited by examiner

*Primary Examiner* — Adam D Tissot
(74) *Attorney, Agent, or Firm* — Paul Liu; Glenn Theodore Mathews; Perkins Coie, LLP (57) ABSTRACT

A power management system is disclosed for managing power in a vehicle. The system may include a power distribution unit (PDU) communicably coupled to a power controller unit located in the vehicle. The power controller unit comprises a microcontroller configured to: receive, from the PDU, a temperature value that indicates a temperature of the PDU, one or more voltage values from the one or more voltage sensors, or one or more current values from the one or more current sensors, perform a determination that the temperature value, the one or more voltage values, or the one or more current values are below one or more of their respective pre-determined threshold values, and send, after the determination, a health status message to a computer located in the vehicle, where the health status message indicates that the PDU is operating in a safe operating condition.

20 Claims, 5 Drawing Sheets

POWER MANAGEMENT SYSTEM FOR AUTONOMOUS VEHICLES

TECHNICAL FIELD

This document relates to systems, apparatus, and methods to manage power distribution of power devices in an autonomous vehicle.

BACKGROUND

Autonomous vehicle navigation is a technology that can allow a vehicle to sense the position and movement of vehicles around an autonomous vehicle and, based on the sensing, control the autonomous vehicle to safely navigate towards a destination. An autonomous vehicle may control the steering angle, a throttle amount to control the speed of the autonomous vehicle, gear changes, and/or a breaking amount to control the extent to which the brakes are engaged. An autonomous vehicle may operate in several modes. In some cases, an autonomous vehicle may allow a driver to operate the autonomous vehicle as a conventional vehicle by controlling the steering, throttle, clutch, gear shifter, and/or other devices. In other cases, a driver may engage the autonomous vehicle navigation technology to allow the vehicle to be driven by itself. Several devices located in an autonomous vehicle need electrical power to allow the autonomous vehicle to operate.

SUMMARY

This patent document describes systems, apparatus, and methods for managing power distribution of power devices in an autonomous vehicle that provide power to electrical devices on or in the autonomous vehicle.

An exemplary system for managing power in a vehicle comprises a power distribution unit (PDU), a power controller unit, and a computer located in the vehicle. The PDU comprises an input connector configured to receive electrical power from a power source in the vehicle, one or more output connectors configured to provide electrical power to one or more devices on or in the vehicle, one or more relays, wherein each relay is electrically coupled in between the input connector and one of the one or more output connectors, a temperature sensor, one or more voltage sensors associated with the one or more output connectors, and one or more current sensors associated with the one or more output connectors. The power controller unit is communicatively coupled to the PDU, where the power controller unit comprises a microcontroller configured to: receive, from the PDU, a temperature value that indicates a temperature of the PDU, one or more voltage values from the one or more voltage sensors, and one or more current values from the one or more current sensors; perform a determination that the temperature value, the one or more voltage values, or the one or more current values are below one or more of their respective pre-determined threshold values; and send, after the determination, a health status message to a computer located in the vehicle, where the health status message indicates that the PDU is operating in a safe operating condition.

In some embodiments, the health status message indicates that the temperature value, or the one or more voltage values, or the one or more current values of the PDU is/are within acceptable level(s). In some embodiments, the computer is electrically connected to an output connector of the PDU, and wherein the computer includes a processor configured to: receive the health status message. In some embodiments, the power controller unit comprising the microcontroller is further configured to: receive a voltage value from a voltage sensor associated with an output connector or receive a current value from a current sensor associated with the output connector; in response to determining that the voltage value is above a pre-determined threshold voltage value or that the current value is above a pre-determined threshold current value: send, to the PDU, a command that instructs a relay associated with the output connector to open; receive, from the PDU, a relay status that indicates that the relay is open; and send, to the computer and after receiving the relay status, a second health status message that indicates that the voltage value or the current value of the output connector is outside an acceptable level and that the relay associated with the output connector is open.

In some embodiments, the computer comprises a processor configured to: send, to the power controller unit, a command that instructs one or more relays to open; and where the power controller unit comprising the microcontroller is further configured to: upon receiving the command, send another command to the PDU that instructs the one or more relays to open; receive, from the PDU, a relay status that indicates that the one or more relays are open; and send, to the computer and after receiving the relay status, a second health status message that indicates the one or more relays associated with the one or more output connectors are open. In some embodiments, the power controller unit comprising the microcontroller is further configured to: send, to the PDU, a command that adjusts (e.g., increases or decreases) an output voltage of a controllable DC/DC converter located in series between the input connector and an output connector. In some embodiments, the computer and the power controller unit are the same device. In some embodiments, the computer and the power controller unit are different devices.

An exemplary method of managing power in a vehicle comprises receiving, from a power distribution unit (PDU) located in the vehicle, a temperature value that indicates a temperature of the PDU, one or more voltage values, and one or more current values; performing a determination that the temperature value, the one or more voltage values, or the one or more current values are below one or more of their respective pre-determined threshold values; and sending, after the determination, a health status message to a computer located in the vehicle, wherein the health status message indicates that the PDU is operating in a safe operating condition.

In some embodiments, the method further comprises receiving, from the PDU, a voltage value associated with an output connector or receiving a current value associated with the output connector; in response to determining that the voltage value is above a pre-determined threshold voltage value or that the current value is above a pre-determined threshold current value: sending, to the PDU, a command that instructs a relay associated with the output connector to open; receiving, from the PDU, a relay status that indicates that the relay is open; and sending, to the computer and after receiving the relay status, a second health status message that indicates that the voltage value or the current value of the output connector is outside an acceptable level and that the relay associated with the output connector is open. In some embodiments, the method further comprises receiving, from the PDU, a voltage value associated with an output connector; and sending, to the PDU, a command that instructs a relay associated with the output connector to open in response to determining that the voltage value is above a pre-determined threshold voltage value In some embodiments, the method further comprises receiving, from the computer, a command that instructs one or more relays to open; sending, after receiving the command, another command to the PDU instructing one or more relays in the PDU to open; receiving, from the PDU, a relay status that indicates that the one or more relays are open; and sending, to the computer and after receiving the relay status, a second health status message that indicates the one or more relays associated with an output connector are open. In some embodiments, the method further comprises sending, to the PDU, a command that adjusts an output voltage of a controllable DC/DC converter located in series between an input connector and an output connector.

An exemplary non-transitory computer readable storage medium includes code stored thereon, the code, when executed by a processor, causing the processor to implement a method of managing power in a vehicle comprising: receiving, from a power distribution unit (PDU) located in the vehicle, a temperature value that indicates a temperature of the PDU, one or more voltage values, and one or more current values; performing a determination that the temperature value, the one or more voltage values, or the one or more current values are below one or more of their respective pre-determined threshold values; and sending, after the determination, a health status message to a computer located in the vehicle, wherein the health status message indicates that the PDU is operating in a safe operating condition.

In yet another exemplary aspect, the above-described method is embodied in a non-transitory computer readable storage medium. The non-transitory computer readable storage medium includes code that when executed by a processor, causes the processor to perform the methods described in this patent document.

In yet another exemplary embodiment, a device that is configured or operable to perform the above-described methods is disclosed.

The above and other aspects and their implementations are described in greater detail in the drawings, the descriptions, and the claims.

DETAILED DESCRIPTION

Development of autonomous driving technology has placed an increased demand on power consumption in an autonomous vehicle. In a conventional vehicle without autonomous driving capabilities is designed with a power source (e.g., alternator) that can supply the power needs of the various devices in the conventional vehicle (e.g., engine, radio, anti-lock brake system (ABS), etc.). Autonomous vehicles include several sophisticated and sensitive devices and sensors that can cause the autonomous vehicle to consume more power than a conventional vehicle. However, there is a limited amount of power on an autonomous vehicle. Thus, to address at least this technical issue, this patent document describes techniques to optimize power consumption in an autonomous vehicle. For example, the exemplary techniques can control operations of power distribution units (PDUs) that supplies power to devices in an autonomous vehicle so that the power budget of the battery, alternator, or AC/DC charger can be better managed.

Figure 1:
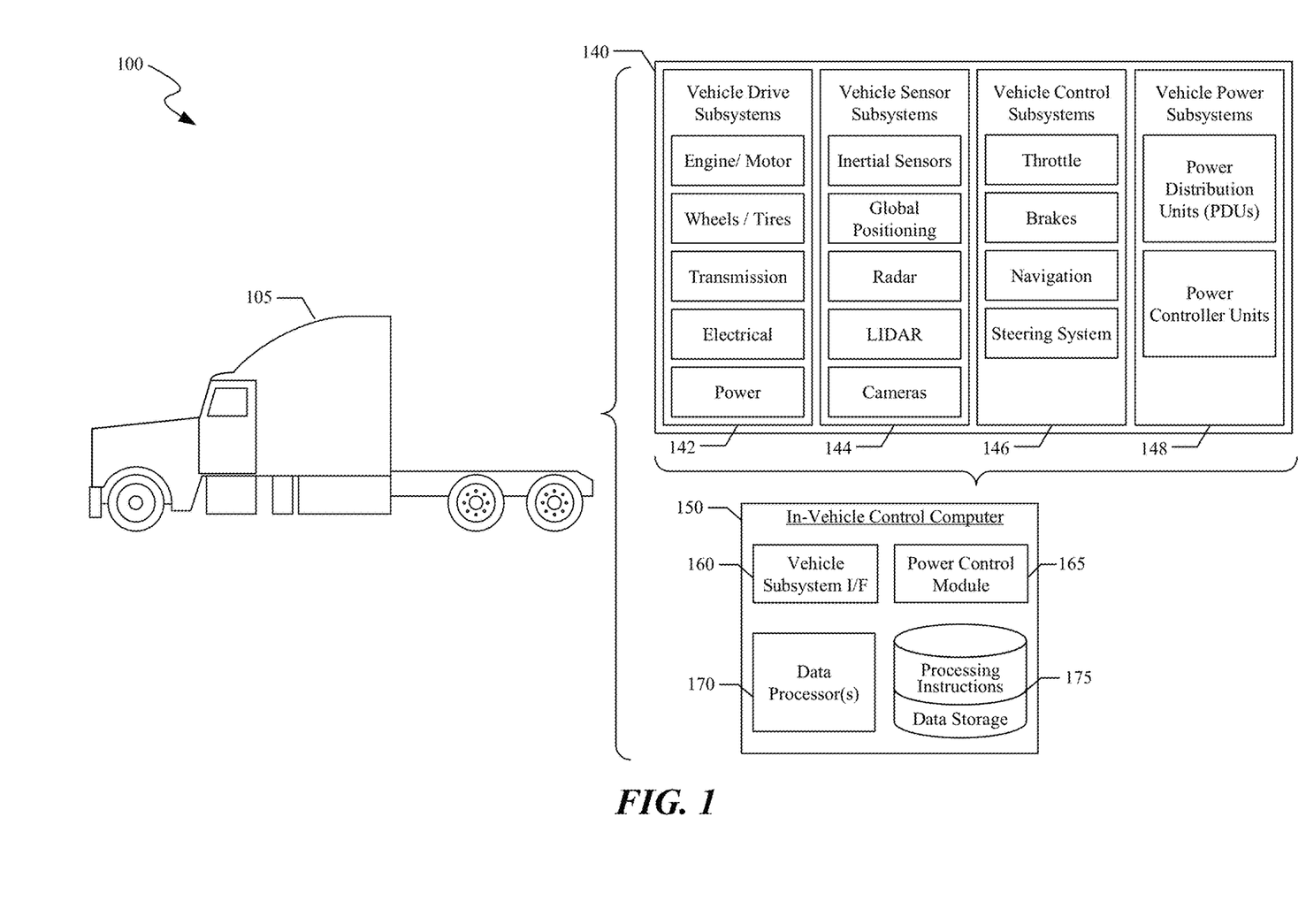
FIG. 1 shows a block diagram of an example vehicle ecosystem in which an exemplary power management system for an autonomous vehicle can be implemented

FIG. 1 shows a block diagram of an example vehicle ecosystem 100 in which an exemplary power management system for an autonomous vehicle 105 can be implemented. The vehicle ecosystem 100 includes several systems and electrical devices that can generate and/or deliver one or more sources of information/data and related services to the in-vehicle control computer 150 that may be located in an autonomous vehicle 105. Examples of autonomous vehicle 105 include a car, a truck, or a semi-trailer truck. The in-vehicle control computer 150 can be in data communication with a plurality of vehicle subsystems 140, all of which can be resident in an autonomous vehicle 105. A vehicle subsystem interface 160 is provided to facilitate data communication between the in-vehicle control computer 150 and the plurality of vehicle subsystems 140. The vehicle subsystem interface can include a wireless transceiver, a Controller Area Network (CAN) transceiver, an Ethernet transceiver, or any combination thereof.

The autonomous vehicle 105 may include various vehicle subsystems that support of the operation of autonomous vehicle 105. The vehicle subsystems may include a vehicle drive subsystem 142, a vehicle sensor subsystem 144, a vehicle control subsystem 146 and/or a vehicle power subsystem 148. The vehicle drive subsystem 142 may include components operable to provide powered motion for the autonomous vehicle 105. In an example embodiment, the vehicle drive subsystem 142 may include an engine or motor, wheels/tires, a transmission, an electrical subsystem, and a power source (e.g., battery and/or alternator).

The vehicle sensor subsystem 144 may include a number of sensors configured to sense information about an environment or condition of the autonomous vehicle 105. For example, the vehicle sensor subsystem 144 may include an inertial measurement unit (IMU), a Global Positioning System (GPS) transceiver, a RADAR unit, a laser range finder/LIDAR unit, and/or one or more cameras or image capture devices. The vehicle sensor subsystem 144 may also include sensors configured to monitor internal systems of the autonomous vehicle 105 (e.g., an $O_2$ monitor, a fuel gauge, an engine oil temperature).

The IMU may include any combination of sensors (e.g., accelerometers and gyroscopes) configured to sense position and orientation changes of the autonomous vehicle 105 based on inertial acceleration. The GPS transceiver may be any sensor configured to estimate a geographic location of the autonomous vehicle 105. For this purpose, the GPS transceiver may include a receiver/transmitter operable to provide information regarding the position of the autonomous vehicle 105 with respect to the Earth. The RADAR unit may represent a system that utilizes radio signals to sense objects within the local environment of the autonomous vehicle 105. In some embodiments, in addition to sensing the objects, the RADAR unit may additionally be configured to sense the speed and the heading of the objects proximate to the autonomous vehicle 105. The laser range finder or LIDAR unit may be any sensor configured to sense objects in the environment in which the autonomous vehicle 105 is located using lasers. The cameras may include one or more devices configured to capture a plurality of images of the environment of the autonomous vehicle 105. The cameras may be still image cameras or motion video cameras.

The vehicle control system 146 may be configured to control operation of the autonomous vehicle 105 and its components. Accordingly, the vehicle control system 146 may include various elements such as a throttle, a brake unit, a navigation unit, and/or a steering system.

The throttle may be configured to control, for instance, the operating speed of the engine and, in turn, control the speed of the autonomous vehicle 105. The brake unit can include any combination of mechanisms configured to decelerate the autonomous vehicle 105. The brake unit can use friction to slow the wheels in a standard manner. The navigation unit may be any system configured to determine a driving path or route for the autonomous vehicle 105. The navigation unit may additionally be configured to update the driving path dynamically while the autonomous vehicle 105 is in operation. In some embodiments, the navigation unit may be configured to incorporate data from the GPS transceiver and one or more predetermined maps so as to determine the driving path for the autonomous vehicle 105.

The vehicle control system 148 may be configured to control operation of PDUs located in the autonomous vehicle 105. The PDUs have an input that is directly or indirectly electrically connected to the power source of the autonomous vehicle 105 (e.g., alternator). Each PDU can have one or more electrical receptacles or one or more electrical connectors to provide power to one or more devices connected to a PDU. The vehicle control system 148 can also include power controller units, where each power controller unit can communicate with one PDU and provide information about the one PDU to the power control module 165. Features of the PDUs and power controller units will be further described in FIGS. 2 to 5 and additional embodiments in this patent document.

Many or all of the functions of the autonomous vehicle 105 can be controlled by the in-vehicle control computer 150. The in-vehicle control computer 150 may include at least one data processor 170 (which can include at least one microprocessor) that executes processing instructions stored in a non-transitory computer readable medium, such as the data storage device 175 or memory. The in-vehicle control computer 150 may also represent a plurality of computing devices that may serve to control individual components or subsystems of the autonomous vehicle 105 in a distributed fashion. In some embodiments, the data storage device 175 may contain processing instructions (e.g., program logic) executable by the data processor 170 to perform various methods and/or functions of the autonomous vehicle 105, including those described in this patent document. For instance, the data processor 170 executes the operations associated with power control module 165 for managing power at least by controlling the PDUs in the autonomous vehicle 105. The data storage device 175 may contain additional instructions as well, including instructions to transmit data to, receive data from, interact with, or control one or more of the vehicle drive subsystem 142, the vehicle sensor subsystem 144, the vehicle control subsystem 146, and the vehicle power subsystem 148. In some embodiment, additional components or devices can be added to the various subsystems or one or more components or devices (e.g., LiDAR or Radar shown in FIG. 1) can be removed without affecting the techniques described in this patent document for the power management system. The in-vehicle control computer 150 can be configured to include a data processor 170 and a data storage device 175.

The in-vehicle control computer 150 may control the function of the autonomous vehicle 105 based on inputs received from various vehicle subsystems (e.g., the vehicle drive subsystem 142, the vehicle sensor subsystem 144, the vehicle control subsystem 146, and the vehicle power subsystem 148). For example, the in-vehicle control computer 150 may use input from the vehicle control system 146 in order to control the steering system to avoid an obstacle detected by the vehicle sensor subsystem 144, move in a controlled manner, or follow a path or trajectory. In an example embodiment, the in-vehicle control computer 150 can be operable to provide control over many aspects of the autonomous vehicle 105 and its subsystems.

Figure 2:
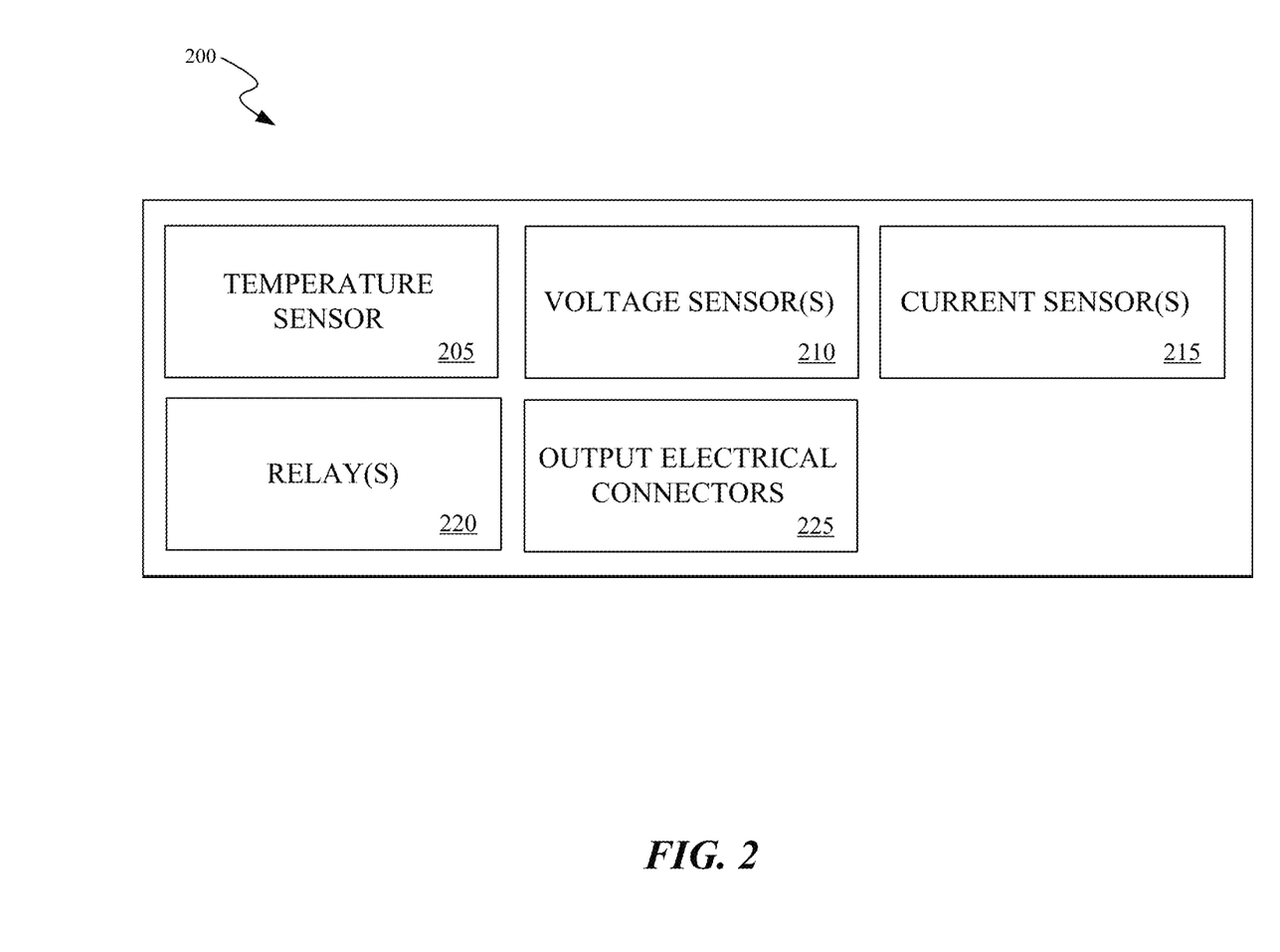
FIG. 2 shows a block diagram of an exemplary power distribution unit (PDU) for a power management system.

FIG. 2 shows a block diagram of an exemplary power distribution unit (PDU) for a power management system. The PDU 200 can include a temperature sensor 205 that can provide a measurement of a temperature of the PDU 200. The PDU 200 can include one or more electrical receptacles or one or more electrical connectors 225 to provide power to one or more devices connected to the PDU 200, such as cameras, LiDARs, RADARs, Ethernet switches, routers, computers, accessories and other peripherals located in an autonomous vehicle.

Each receptacle or connector can be referred to as a channel. Each channel of the PDU 200 can include a voltage sensor 210 and a current sensor 25 that can provide measurements of output voltages and output currents of the PDU 200.

The PDU 200 can also include one or more relays 220, where each relay can be connected in series between the input of the PDU 200, which is electrically coupled to a power source of the vehicle, and one of the electrical receptacles or electrical connectors 225. As further described in this patent document, each relay 220 can be instructed by a power controller unit to either open or close the relay associated with a channel, which would respectively disconnect or connect the vehicle's power source from or to the electrical device(s) connected to the channel. The one or more relays may be MOSFET transistor type relays or any other type of a controllable electrical switch.

In some embodiments, the PDU 200 may include a microcontroller that can generate a message that comprises the measured voltage values (per channel), current values (per channel), temperature value and relay status (per channel). In such embodiments, a transceiver located in the PDU 200 can send the message generated by the microcontroller to a power controller unit. The transceiver may be a wireless transceiver or a CAN transceiver. In some embodiments, the microcontroller in the PDU 200 can determine the presence of a warning or a fault condition and can send a warning or fault message to the power controller unit. The fault condition can indicate electrical or mechanical failure of the PDU 200. For example, a fault code generated by the microcontroller of the PDU 200 can indicate that one of the relays in the PDU 200 has failed to close upon a request or command. The microcontroller of the PDU 200 can also generate warnings based on determining that a measured temperature is above a pre-determined temperature threshold. The over-current or over-temperature warning generated by the PDU 200 can be different from the ones determined by the power controller unit at least because the power controller unit can be provided with information of the nominal range of power consumption by each device by the in-vehicle control computer (e.g., each device connected to each channel of the PDU 200).

Figure 3:
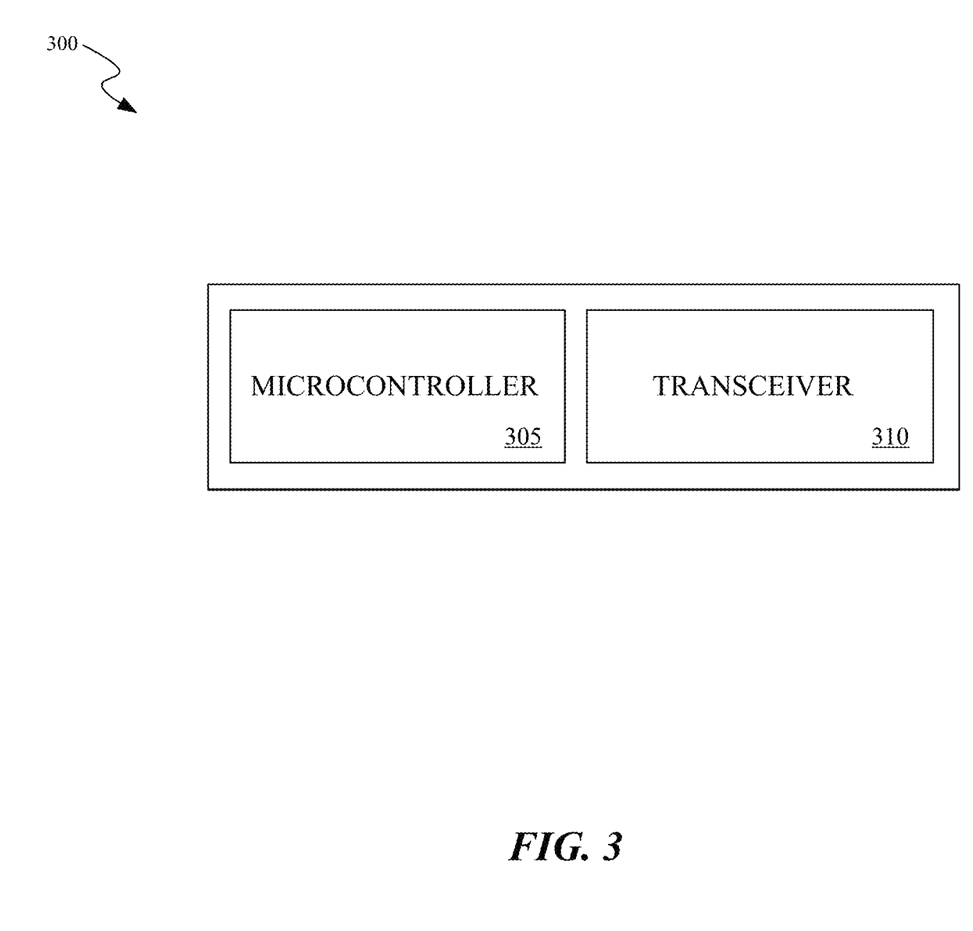
FIG. 3 shows a block diagram of a power controller unit for a power management system.

FIG. 3 shows a block diagram of a power controller unit 300 for a power management system. The power controller unit 300 includes a microcontroller 305 can be programmable to execute code stored in the microcontroller's memory. For example, the microcontroller 305 can execute a command to close a relay on channel #4 in a PDU based on receiving a message from the in-vehicle control computer that instructs the power controller unit to perform such an execution. Thus, the microcontroller unit 305 can send command to the PDU to control the power supplied to one or more devices connected to the PDU.

The microcontroller 305 also uses the information from the PDU to conduct health status evaluation of the PDU. The microcontroller 305 may include a memory that can store pre-determined thresholds for voltage/current per channel per PDU and for temperature per PDU. The microcontroller 305 can perform health status evaluation of a PDU by compared the measured values (e.g., voltage, current, temperature) to the corresponding pre-determined threshold values. In some embodiments, the microcontroller 305 can include voltage, current, and/or temperature sensors and can be electrically connected to a battery in the vehicle so that the microcontroller 305 can perform a battery status monitoring, a battery level estimation and a battery health status evaluation by processing, for example, the voltage or current or temperature measured values of the battery (e.g., batter level or battery temperature) over time.

For example, the microcontroller can determine an over-voltage condition for a channel where a measured voltage exceeds a threshold voltage value, and in response, send a command to the PDU to open the relay associated with that channel. In another example, the microcontroller can determine an over-current condition for a channel where a measured current exceeds a threshold current value, and in response, send a command to the PDU to open the relay associated with that channel. In yet another example, the microcontroller can determine an over-temperature condition for a PDU where a measured temperature exceeds a threshold temperature value for that PDU, and in response, send a command to open all the relays associated with the PDU. In another example, the microcontroller can determine that a battery level is low where a measured battery level (e.g., charge or voltage) is below a threshold battery value, and in response, send a command to open one or more the relays associated with the PDU.

In some embodiments, the microcontroller 305 can send to the in-vehicle control computer the health status or other status of the PDU and/or the health status of the channels of the PDU. In some embodiments, if the temperature of a PDU is below a threshold and if the voltage and current values are below their corresponding thresholds, then microcontroller 305 can generate a health status message that can indicate that the temperature of the PDU, and the voltage and current levels per channel of the PDU are within acceptable levels. In some embodiments, the health status message may include the measured values of the temperature, voltage(s), and current(s). In some embodiments, the health status may include a message that indicates that the PDU is operating at an overall safe operating condition (e.g., the message includes "PDU #1 Status: good") if the temperature of a PDU is below a threshold and if the voltage and current values are below their corresponding thresholds. In another example, the health status message may indicates the entire system is drawing power at a rate faster than the battery charging rate. The health status may include a message that indicates the estimated battery level and estimated runtime left. Based on a health status message received, the in-vehicle control computer can send a power off request message to the power controller unit (shown in FIG. 4) to open one or more relays of a PDU associated with non-essential devices. A pre-determined list comprising one or more non-essential devices and their corresponding PDU channels can be stored in data storage of the in-vehicle control computer.

The power controller unit may also include a transceiver 310 that can send and receive data via, for example, a CAN bus, Local Interconnect Network (LIN) bus, or Ethernet. In some embodiments, the power controller unit can send the following commands: power connection (relay, switch, or MOSFETS) on/off command; request power information from PDU; power system health status, battery level measurement and estimation, power consumption calculation; device shutdown request to the in-vehicle control computer; device shutdown confirmation to the in-vehicle control computer; and device current status to the in-vehicle control computer.

Figure 4:
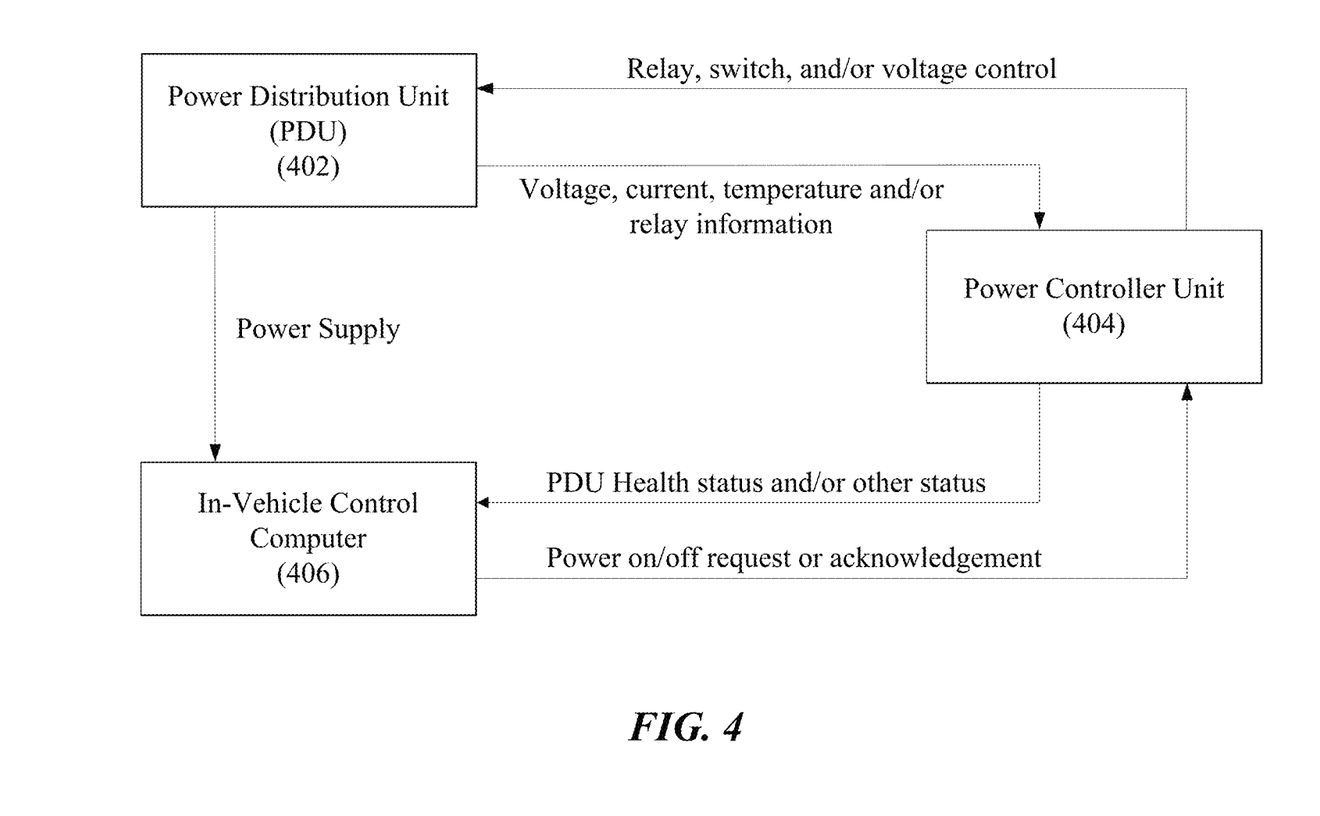
FIG. 4 shows a block diagram of a PDU, a power controller unit, and an in-vehicle control computer.

FIG. 4 shows a block diagram of a PDU, a power controller unit, and an in-vehicle control computer. The PDU 402 is communicably coupled to the power controller unit 404 and the power controller unit 404 is communicably coupled to the in-vehicle control computer 406. The in-vehicle control computer is electrically connected to the PDU 402 to receive electrical power from the PDU 402. As shown in FIG. 4, the PDU 402 can periodically (e.g., every 2 seconds) send to the power controller unit 404 the measured voltage and current values per channel, the measured temperature value, and a status of the relay (e.g., "open" or "close") per channel.

The power controller unit 404 can control the relay or switch of each channel by sending a command to the PDU's channel to open the relay or switch of one or more channels. In some embodiments, the power controller unit 404 can control the voltage generated at each output connector. For example, a channel associated with the PDU may include a controllable or a variable DC/DC converter that receives an input voltage provided by the input connector of the PDU and generates a controllable output DC voltage. The power controller unit 404 can send instruction to adjust the output voltage of the DC/DC converter of a channel. In some embodiments, each channel of the PDU may have a DC/DC converter electrically coupled in between the input connector and the output connector of the PDU.

The power controller unit 404 can monitor the PDU 402 and estimate a total power consumed by device(s) connected to the PDU 402 based on the received voltage and current measurements per channel. The power controller unit 404 can determine the health of the PDU and the usage of the power budget. This health status or warning can be sent by the power controller unit 404 to the in-vehicle control computer 406. The power controller unit with the power control module of the in-vehicle control computer can determine the proper control to apply to the PDU 402. The power controller unit 404 manages the PDU 402 according to the status or the request from the rest of the autonomous driving system, such as the in-vehicle control computer 406. The in-vehicle control computer 406 is the same as the in-vehicle control computer described in FIG. 1.

The power controller unit 404 can also receive from the in-vehicle control computer 406 power on/off request to close or open the relay/switch associated with one or more channels of the PDU 402. In some embodiments, the in-vehicle control computer 406 can send a power on-off acknowledgement to the power controller unit 404 in response to the power controller unit 404 sending a command to turn off the in-vehicle control computer 406 or a peripheral associated with the in-vehicle control computer 406.

The power controller unit 404 can with the in-vehicle control computer 406 decide which channel on the PDU to open to disconnect power from a device to either save power consumption or restore battery state of charge. For example, the in-vehicle control computer can send a message to the power controller unit 404 to turn off a channel on the PDU 402 that is associated with a LiDAR sensor no long being used by the in-vehicle control computer 406. In another example, the power controller unit can, based on determining that a channel on the PDU 402 is operating in an over-voltage condition, send a command to the PDU 402 to open the relay associated with the channel experiencing the over-voltage condition.

The power controller unit 404 receives information from the power control module of the in-vehicle control computer 406 regarding if each autonomous driving hardware component can be powered off. In some embodiments, the power controller unit 404 and the in-vehicle control computer 406 can be separate devices. In some embodiments, the operations described for the power controller unit 404 can be performed by the power control module of the in-vehicle control computer 406. In such embodiments, the in-vehicle control computer 406 can directly communicate with the PDU 402 without a separate power controller unit 404. Thus, in such embodiments, the power controller unit 404 and the in-vehicle control computer 406 can be the same device. In some other embodiments, the controller unit 404 may be located in the PDU 402.

Figure 5:
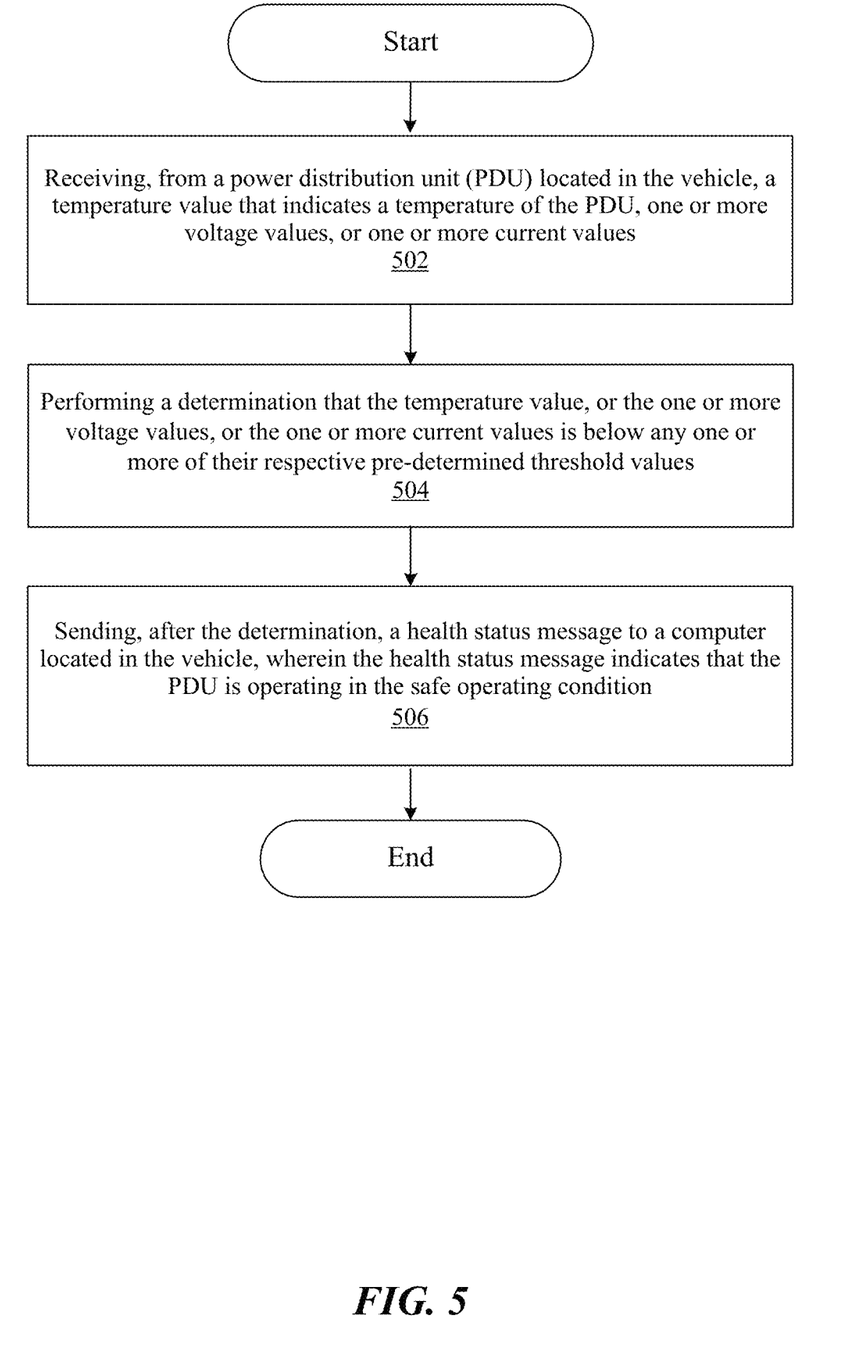
FIG. 5 shows an exemplary flow diagram to manage power in a vehicle.

FIG. 5 shows an exemplary flow diagram to manage power in a vehicle. The method includes a power controller unit comprising a microcontroller configured to perform a receiving operation 502 where the microcontroller receives, from a PDU, a temperature value that indicates a temperature of the PDU, one or more voltage values from the one or more voltage sensors, and one or more current values from the one or more current sensors. The PDU includes an input connector configured to receive electrical power from a power source in the vehicle, one or more output connectors configured to provide electrical power to one or more devices on or in the vehicle, one or more relays, wherein each relay is electrically coupled in between the input connector and one of the one or more output connectors, a temperature sensor, one or more voltage sensors associated with the one or more output connectors, one or more current sensors associated with the one or more output connectors At the performing operation 504, the microcontroller performs a determination that the temperature value, the one or more voltage values, and/or the one or more current values are below one or more of their respective pre-determined threshold values. At the sending operation 506, the microcontroller sends, after the determination, a health status message to a computer located in the vehicle, where the health status message indicates that the PDU is operating in a safe operating condition. In some embodiments, the health status message indicates that the temperature, the one or more voltage values, and/or the one or more current values of the PDU is within acceptable level(s). In some embodiments, the computer is configured to receive the health status message.

In some embodiments, the microcontroller in the power controller unit is further configured to: receive a voltage value from a voltage sensor associated with an output connector or receive a current value from a current sensor associated with the output connector; in response to determining that the voltage value is above a pre-determined threshold voltage value or that the current value is above a pre-determined threshold current value: send, to the PDU, a command that instructs a relay associated with the output connector to open; receive, from the PDU, a relay status that indicates that the relay is open; and send, to the computer and after receiving the relay status, a second health status message that indicates that the voltage value or the current value of the output connector is outside an acceptable level and that the relay associated with the output connector is open.

In some embodiments, the computer comprises a processor configured to: send, to the power controller unit, a command that instructs the one or more relays to open; and where the power controller unit comprising the microcontroller is further configured to: upon receiving the command, send another command to the PDU that instructs the one or more relays to open; receive, from the PDU, a relay status that indicates that the one or more relays are open; and send, to the computer and after receiving the relay status, a second health status message that indicates the one or more relays associated with an output connector are open.

In some embodiments, the power controller unit comprising the microcontroller is further configured to: send, to the PDU, a command that adjusts an output voltage of a controllable DC/DC converter located in series between the input connector and an output connector. In some embodiments, the computer and a power controller unit are the same device.

In some embodiments, a method includes receiving, from a power distribution unit (PDU) located in the vehicle, one or more voltage values, performing a determination that the one or more voltage values is below one or more pre-determined threshold values, and sending, after the determination, a health status message to a computer located in the vehicle, wherein the health status message indicates that the PDU is operating in a safe operating condition. In some embodiments, a method includes receiving, from the PDU, a temperature value that indicates a temperature of the PDU, performing a second determination that the temperature value is below a pre-determined threshold value, and sending, after the second determination, a second health status message to the computer, wherein the second health status message indicates that the PDU is operating in the safe operating condition.

In this document the term "exemplary" is used to mean "an example of" and, unless otherwise stated, does not imply an ideal or a preferred embodiment. In this document, the term "microcontroller" can include a processor and its associated memory.

Some of the embodiments described herein are described in the general context of methods or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media can include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes.

Some of the disclosed embodiments can be implemented as devices or modules using hardware circuits, software, or combinations thereof. For example, a hardware circuit implementation can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate protocols.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few implementations and examples are described and other implementations, enhancements and variations can be made based on what is described and illustrated in this disclosure.

What is claimed is:

1. A system for managing power in a vehicle, comprising:
a power distribution unit (PDU) located in the vehicle, and comprising:
an input connector configured to receive electrical power from a power source in the vehicle,
one or more output connectors configured to provide electrical power to one or more devices on or in the vehicle,
one or more relays, wherein each relay is electrically coupled in between the input connector and one of the one or more output connectors,
a temperature sensor,
one or more voltage sensors associated with the one or more output connectors, and
one or more current sensors associated with the one or more output connectors;
a power controller unit communicatively coupled to the PDU and to a computer located in the vehicle, wherein the power controller unit comprises a microcontroller configured to:
receive, from the PDU, a temperature value that indicates a temperature of the PDU, one or more voltage values from the one or more voltage sensors, or one or more current values from the one or more current sensors;
perform a determination that the temperature value, or the one or more voltage values, or the one or more current values is below one or more of their respective pre-determined threshold values;
send, after the determination, a health status message to the computer located in the vehicle, wherein the health status message indicates that the PDU is operating in a safe operating condition;
receive a voltage value from a voltage sensor associated with an output connector; and
in response to a determination that the voltage value is above a pre-determined threshold voltage value:
send, to the PDU, a command that instructs a relay associated with the output connector to open;
receive, from the PDU, a relay status that indicates that the relay is open;
send, to the computer and after receiving the relay status, a second health status message that indicates that the voltage value of the output connector is outside an acceptable level and that the relay associated with the output connector is open; and
receive, from the PDU, a fault code that indicates that a second relay in the PDU has failed to close in response to a second command sent by the power controller unit to the PDU;
the computer located in the vehicle,
wherein the computer located in the vehicle is a device of the one or more devices to which at least one of the one or more output connectors provides electrical power,
wherein the computer is configured to store information that identifies a device of the one or more devices as a non-essential device and a corresponding output connector of the PDU for the device, and
wherein the computer is configured to send a power off request message to the power controller unit to open one relay associated with the device that is the non-essential device based on a third health status message received by the computer.

2. The system of claim 1, wherein the health status message indicates that the temperature value, or the one or more voltage values, or the one or more current values of the PDU is within an acceptable level.

3. The system of claim 1, wherein the computer is electrically connected to an output connector of the PDU, and wherein the computer includes a processor configured to:
receive the health status message.

4. The system of claim 1,
wherein the computer comprises a processor configured to:
send, to the power controller unit, a command that instructs the one or more relays to open; and
wherein the power controller unit comprising the microcontroller is further configured to:

upon receiving the command, send another command to the PDU that instructs the one or more relays to open;

receive, from the PDU, a relay status that indicates that the one or more relays are open; and send, to the computer and after receiving the relay status, a fourth health status message that indicates the one or more relays associated with the one or more output connectors are open.

5. The system of claim 1, wherein the power controller unit comprising the microcontroller is further configured to:

send, to the PDU, a command that adjusts an output voltage of a controllable DC/DC converter located in series between the input connector and an output connector.

6. The system of claim 1, wherein the computer and the power controller unit are the same device.

7. A method of managing power in a vehicle, comprising:

receiving, from a power distribution unit (PDU) located in the vehicle, a temperature value that indicates a temperature of the PDU, one or more voltage values, or one or more current values;

performing a determination that the temperature value, the one or more voltage values, or the one or more current values are below one or more of their respective pre-determined threshold values;

sending, after the determination, a health status message to a computer located in the vehicle, wherein the health status message indicates that the PDU is operating in a safe operating condition;

receiving a voltage value from a voltage sensor associated with an output connector of the PDU; and in response to determining that the voltage value is above a pre-determined threshold voltage value:

sending, to the PDU, a command that instructs a relay associated with the output connector to open;

receiving, from the PDU, a relay status that indicates that the relay is open;

sending, to the computer and after receiving the relay status, a second health status message that indicates that the voltage value of the output connector is outside an acceptable level and that the relay associated with the output connector is open;

receiving, from the PDU, a fault code that indicates that a second relay in the PDU has failed to close in response to a second command sent to the PDU; and receiving, from the computer, a power off request message to open one relay associated with a device that is a non-essential device, wherein the power off request message is based on a third health status message sent to the computer.

8. The method of claim 7, wherein the health status message includes the temperature value, or the one or more voltage values, or the one or more current values of the PDU.

9. The method of claim 7, further comprising:

receiving, from the PDU, a current value associated with an output connector;

in response to determining that the current value is above a pre-determined threshold current value:

sending, to the PDU, a command that instructs a relay associated with the output connector to open;

receiving, from the PDU, a relay status that indicates that the relay is open; and sending, to the computer and after receiving the relay status, a fourth health status message that indicates that the current value of the output connector is outside an acceptable level and that the relay associated with the output connector is open.

10. The method of claim 7, further comprising:

sending a command to the PDU instructing one or more relays in the PDU to open;

receiving, from the PDU, a relay status that indicates that the one or more relays are open; and sending, to the computer and after receiving the relay status, a fourth health status message that indicates the one or more relays associated with an output connector are open.

11. The method of claim 7, further comprising:

sending, to the PDU, a command that increases an output voltage of a controllable DC/DC converter located in series between an input connector and an output connector.

12. The method of claim 7, wherein the computer and a power controller unit are different devices.

13. A non-transitory computer readable storage medium having code stored thereon, the code, when executed by a processor, causing the processor to implement a method of managing power in a vehicle comprising:

receiving, from a power distribution unit (PDU) located in the vehicle, one or more voltage values;

performing a determination that the one or more voltage values is below one or more pre-determined threshold values;

sending, after the determination, a health status message to the computer located in the vehicle, wherein the health status message indicates that the PDU is operating in a safe operating condition;

receiving a voltage value from a voltage sensor associated with an output connector of the PDU; and in response to determining that the voltage value is above a pre-determined threshold voltage value:

sending, to the PDU, a command that instructs a relay associated with the output connector to open;

receiving, from the PDU, a relay status that indicates that the relay is open; and sending, to the computer and after receiving the relay status, a second health status message that indicates that the voltage value of the output connector is outside an acceptable level and that the relay associated with the output connector is open;

receiving, from the PDU, a fault code that indicates that a second relay in the PDU has failed to close in response to a second command sent to the PDU; and receiving, from the computer, a power off request message to open one relay associated with a device that is a non-essential device, wherein the power off request message is based on a third health status message sent to the computer.

14. The non-transitory computer readable storage medium of claim 13, wherein the health status message indicates that the one or more voltage values are within acceptable levels.

15. The non-transitory computer readable storage medium of claim 13, wherein the health status message includes the one or more voltage values.

16. The non-transitory computer readable storage medium of claim 13, wherein the method further comprises:

receiving, from the PDU, a current value associated with an output connector;

in response to determining that the current value is above a pre-determined threshold current value:

sending, to the PDU, a command that instructs a relay associated with the output connector to open;

receiving, from the PDU, a relay status that indicates that the relay is open; and sending, to the computer and after receiving the relay status, a fourth health status message that indicates that the current value of the output connector is outside an acceptable level and that the relay associated with the output connector is open.

17. The non-transitory computer readable storage medium of claim 13, wherein the method further comprises:

sending, to the PDU, a command that decreases an output voltage of a controllable DC/DC converter located in series between an input connector and an output connector.

18. The non-transitory computer readable storage medium of claim 13, wherein the method further comprises:

receiving, from the PDU, a temperature value that indicates a temperature of the PDU;

performing a second determination that the temperature value is below a pre-determined threshold value; and sending, after the second determination, a fourth health status message to the computer, wherein the fourth health status message indicates that the PDU is operating in the safe operating condition.

19. The system of claim 1, wherein the health status message includes the temperature value, or the one or more voltage values, or the one or more current values of the PDU.

20. The system of claim 1, wherein the power controller unit comprises the microcontroller that is further configured to receive, from the PDU, a current value associated with an output connector;

in response to a determination that the current value is above a pre-determined threshold current value:

send, to the PDU, a command that instructs a relay associated with the output connector to open;

receive, from the PDU, a relay status that indicates that the relay is open; and send, to the computer and after receiving the relay status, a fourth health status message that indicates that the current value of the output connector is outside an acceptable level and that the relay associated with the output connector is open.

* * * * *